United States Patent [19]

Engel et al.

[11] Patent Number: 5,208,595
[45] Date of Patent: May 4, 1993

[54] DIGITALLY CONTROLLED ADAPTIVE SLEW RATE DELTA MODULATOR

[75] Inventors: Melvyn Engel, Scottsdale; Michael A. Sowell, Chandler; Michael D. Bethel, Scottsdale, all of Ariz.

[73] Assignee: WavePhore, Inc., Tempe, Ariz.

[21] Appl. No.: 748,023

[22] Filed: Aug. 21, 1991

[51] Int. Cl.⁵ .......................................... H03M 3/02
[52] U.S. Cl. ..................... 341/143; 341/166; 375/28
[58] Field of Search ............... 341/140, 144, 155, 166, 341/143, 164; 375/28

[56] References Cited

U.S. PATENT DOCUMENTS

| | | | |
|---|---|---|---|
| 3,706,944 | 12/1972 | Tewksbury | 332/11 D |
| 3,723,909 | 3/1973 | Condor | 332/11 D |
| 3,839,675 | 10/1974 | Wernikoff et al. | 325/38 |
| 4,384,278 | 5/1983 | Benjamin | 341/143 |
| 4,411,002 | 10/1983 | Auger | 341/143 |
| 4,490,714 | 12/1984 | van de Plassche et al. | 340/347 |
| 4,633,196 | 12/1986 | Peled et al. | 332/11 D |
| 4,843,390 | 6/1989 | van Bavel et al. | 341/139 |
| 4,920,544 | 4/1990 | Endo et al. | 375/26 |
| 5,021,786 | 6/1991 | Gerdes | 341/143 |
| 5,043,729 | 8/1991 | Fujimoto | 341/152 |
| 5,124,706 | 6/1992 | Gerdes | 341/156 |

OTHER PUBLICATIONS

International Search Report for International Application No. PCT/US92/01192 (date of mailing 21 Sep. 1992).

Tomasi, Wayne, *Electronic Communications Systems: Fundamentals Through Advanced*, Prentice Hall, Englewood Cliffs, N.J. 1988 (pp. 650–655).

Primary Examiner—Marc Hoff
Attorney, Agent, or Firm—Spensley Horn Jubas & Lubitz

[57] ABSTRACT

A delta modulator automatically adjusting the slewing rate is disclosed. In the absence of a transition in the output data of a delta modulator, the current used for the integrator of the delta modulator is increased. When the comparator of the modulator indicates that the feedback signal of the modulator has overshot the input signal, the current is decreased or reversed until the two signals are approximately equal as signalled by a 50% duty cycle.

31 Claims, 3 Drawing Sheets

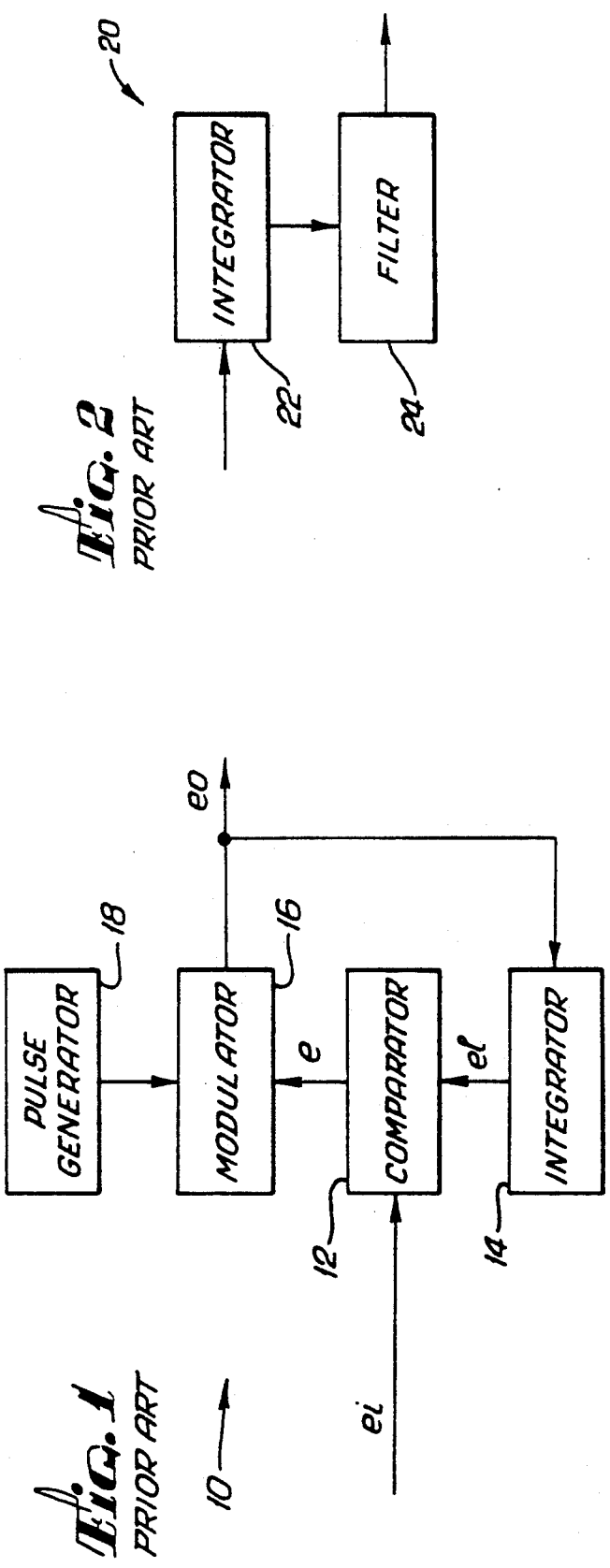

DIGITALLY CONTROLLED ADAPTIVE SLEW RATE DELTA MODULATOR

BACKGROUND OF THE INVENTION

1. Field of the Invention

This invention relates to using improved analog to digital and digital to analog conversion techniques for digital storage of data and more particularly to using such improved analog to digital and digital to analog conversion techniques using delta modulation.

2. Description of the Prior Art

During the last fifteen years, tremendous time, money and efforts have been devoted to translating analog signals into digital data. A wide variety of converters have been developed.

For example, analog to digital conversion can involve either a serial process or a parallel process. Serial conversion frequently allows for a simpler and a less costly implementation but tends to be slower than parallel conversion.

A further consideration is the amount of noise that is permitted. The more bits that are used for quantifying the analog signal, the less quantization noise that will result from the conversion and the greater the dynamic range of the system. For example, using simple pulse code modulation (PCM), 128 separate levels as represented by 7 bits are required for a dynamic of 42 dB while 131,072 separate levels or 17 bits is required for a dynamic range greater than 100 dB.

One digital to analog system that may have relatively high dynamic range and low quantization noise is a delta modulation system, which is a one bit output form of a PCM system. FIG. 1 represents the classic delta modulation system 10. An input analog signal $e_1$ signal is fed through a comparator 12 with the output signal $\epsilon$ of the comparator 12 representing which of the input signal $e_1$ and a feedback output signal $e_1$ of an integrator 14 is greater. That output $\epsilon$ is modulated by a modulator 16 supplied with a periodic pulse train from a pulse generator 18. In effect, the modulator 16 samples the output $\epsilon$ of the comparator 12. The output of the modulator $e_0$ is fed back for integration by an integrator 14.

The result is that the output $e_0$ of the delta modulator 10 is a series of pulses. The pulses represent the rate of change of the signal amplitude from sampling instant to sampling instant.

A system 20 to reconstruct the original input signal $e_1$ is shown in FIG. 2. The output $e_0$ of the delta modulator is integrated by an integrator 22 and is then inputted to a low pass filter 24 to eliminate high frequency noise caused by the sampling or the modulation. Alternatively, a frequency limited integrator may be used.

To reduce noise in the system, a higher frequency for the pulse train can be used. Further, instead of using just one integrator in the modulator and demodulator, two integrators may be used. Details regarding different types of delta modulators may be found in a variety of textbooks, including Philip F. Panther, *Modulation, Noise and Spectral Analysis* (1965).

However, delta modulators have several advantages. They are relatively slow in responding to rapid, large changes in the amplitude of the input signal. Further, delta modulators lose all D.C. information contained in the original analog signal. In addition, delta modulators have limited resolution.

Delta modulators also cause quantization noise in the resultant analog output signal upon conversion back to an analog signal. Commonly, such quantization noise can be avoided by dithering.

Another example of a delta modulator that overcomes some of these problems is shown in U.S. Pat. No. 5,021,786 to Gerdes and owned by the Assignee of the instant application. This patent describes an analog circuit that presets the delta modulator to compensate for overshoot and undershoot. This patent also includes a diode current steering bridge that controls the rate of charging or discharging the signal capacitor used in the delta modulator. The rate control circuit of this prior art patent provides a maximum rate of increase in the magnitude of the integrating current instantly for large changes in magnitude through the use of presets. That instant large current change is potentially undesirable. Further, the rate control circuit is an analog circuit and lacks the ready flexibility of a digital circuit.

Therefore, it is a first object of this invention to provide a relatively simple analog to digital converter that provides high speed conversion with good resolution. It is a further object of this invention to avoid the use of dithering to remove quantization noise and to avoid the loss of DC signals. And it is a still further object of this invention to provide such a converter that is simple and that may be incorporated into one integrated circuit.

SUMMARY OF THE INVENTION

These and other objects are achieved by improved analog to digital and digital to analog signal processors that use delta modulation. In particular, the disclosed invention uses circuitry that has a programmatically alterable slewing rate for an integrator.

When the analog input signal and the feedback signal of the delta modulator are approximately the same, the output data of the modulator toggles at a 50% duty cycle. As the difference between the signals increases, sequential output pulses remain fixed at a high or a low level. In the absence of a predetermined number of transitions in the output signal, the magnitude of the current used for the integrator starts to increase or decrease unless a maximum limit is attained. Until the feedback signal overshoots or undershoots the input signal, the magnitude of the current continues to increase. When the feedback signal overshoots or undershoots the analog input signal, the magnitude of the current is reduced and current flow reverses until the feedback signal overshoots or undershoots the input signal again. This process continually repeats until a 50% duty cycle in the output data is attained again.

When the output data is at a 50% duty cycle, the resolution of the modulator is at its finest. The current flow is controlled, however, so that the modulator will respond more quickly and the feedback signal will track the input signal more closely.

BRIEF DESCRIPTION OF THE DRAWINGS

FIGS. 1 and 2 are block diagrams of a prior art delta modulator and demodulator.

DETAILED DESCRIPTION OF THE PREFERRED EMBODIMENT

Figure 3:
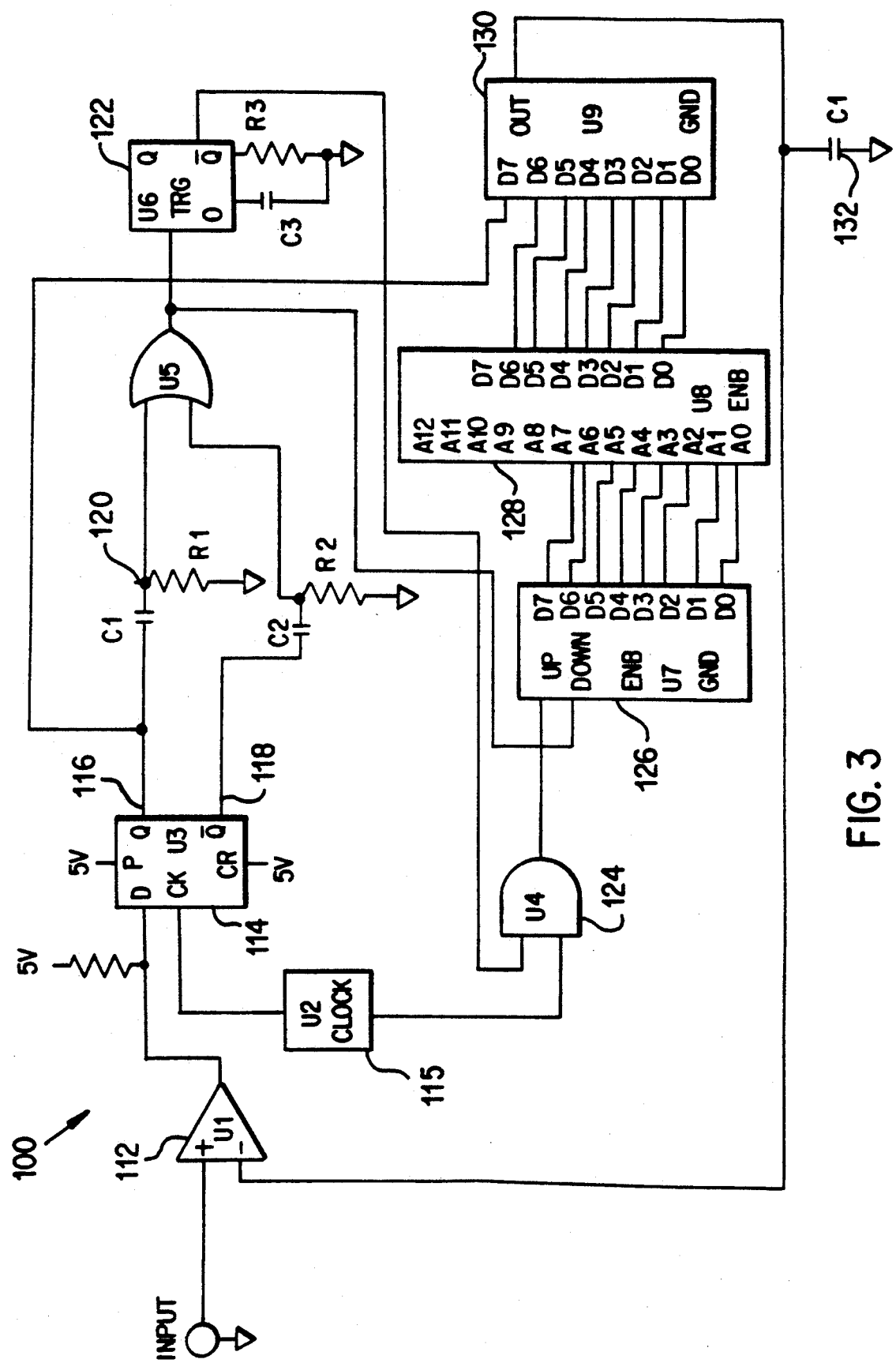
FIG. 3 is a schematic diagram of a delta modulator operating according to the disclosed invention for converting an analog input signal into a digital signal.

FIG. 3 shows a preferred embodiment 100 using the invention. An analog input signal is coupled to a non-inverting input of a comparator 112. The output of the comparator 112 is supplied to a D flip-flop 114 to sample the output of the comparator 112 on the falling edge of the clock signal. The clock signal is provided by a clock generator 115.

Both the normal and the inverted outputs of the flip flop 116 and 118 are provided to an edge detector 120. The output of the edge detector 120 is supplied to a timer 122 comprised of a multivibrator. The timer 122 provides an output signal whenever no edges or transitions in the logic levels in the signals 116 and 118 are detected within three cycles of the clock.

The output of the timer 122 gates the clock through AND gate 124 to provide the incrementing pulses to an up/down counter 126. The decrementing counting pulses are provided directly from the output of the edge detector 120. The counter 126 includes circuitry to prevent underflow or overflow of the counter 126.

The output of the counter 126 is the address to a Read Only Memory (ROM) 128. The ROM 128 acts as a memory look-up table for storing a transfer function that will be described in more detail later. The output data from the ROM 128 is converted into a analog charging current by a current digital to analog converter (DAC) 130.

The direction of the current flow from the DAC 130 is controlled by the normal output 116 of the flip-flop 114. The output 116 is coupled directly to the most significant bit (MSB) input of the digital to analog converter 130. Thus, when the normal output 116 of the D flip flop 114 is high, current flow from the DAC 130 is in a first direction while when the normal output is low, current flow is reversed.

The current from the DAC 130 is accumulated by an integrating capacitor 132 and is fed back as the feedback signal 134 to the inverting input of the comparator 112. The result of this circuit is a delta modulator having a digital output signal 116 with the modulator having an adjustable slew rate for the current integrator.

The adjustable slew rate allows the delta modulator 100 to more quickly respond to greater changes in the analog input signal while having a high degree of resolution for slowly changing signals. In particular, when the output data 116 lags behind changes in the analog input signal for longer time periods, the magnitude of the current supplied by the DAC 130 increases. The magnitude of the current continues to increase pursuant to the steps designated by the DAC 130 with each clock pulse until either a maximum limit is reached or the edge detector 120 provides a pulse indicating that the feedback signal 134 has overshot or undershot the analog input signal.

If the edge detector generates the pulse, the timer 122 is reset, the direction of current flow is reversed, the counter counts down one pulse and the current flow is decreased. If the feedback signal 134 overshoots or undershoots the input signal again, the magnitude of the input signal is reversed and the current flow is again decreased.

When the input signal is changing by less than the resolution of the converter, the output signal 116 typically has a duty cycle of approximately 50%. The direction of current flow reverses with each transition in the output signal 116. When the duty cycle of the output signal is at 50%, current flow is at a minimum and resolution is maximum.

The use of the ROM 128 allows for changing the transfer function between the counter 126 and the output current from the DAC 130. The data stored in the ROM represents a transfer function. For example, the transfer function may be linear with a positive slope, where the data stored in the ROM corresponds to the address. However, the transfer function may also be linear with a negative slope; the transfer function may also be non-linear, such as logarithmic or exponential. Using a non-linear transfer function may provide for large current changes initially after the timer times out and the counter 122 is at a minimum count; subsequent increases in the current flow may be smaller. The data stored in the ROM may further compensate for non-linearities in the DAC 130. If only a linear transfer function is desired, however, the ROM 128 may be eliminated and the counter may be directly coupled to the DAC 130.

The transfer function may be selected by a user of the modulator 100 based upon the expected characteristics of the input signal such as the expected slew rate, the bandwidth of the signal, and the maximum and minimum limits of the signal. Thus, several different transfer functions may be stored in the ROM and the high order address bits may be used for selecting between different transfer functions. If the modulator 100 is contained within one integrated circuit, external pins on the integrated circuit may be used for selecting between transfer functions.

Switching between different transfer functions may be based upon logic or a microcontroller (not shown) that monitors the sequence of the output data 116. Thus, if the input level changes dramatically to be near a limit of the converter 100, the counter 122 may be at its maximum and a high current flow will result. To prevent a substantial undershoot or overshoot, the logic or the controller may change the transfer function temporarily.

Although the specific embodiment uses a multivibrator as a timer, a counter and a ROM for controlling a DAC and an integrating capacitor as an accumulator, other embodiments are also possible. In particular, an accumulator register may be positioned before a DAC and be substituted for the capacitor. In that case, the DAC should preferably be a voltage DAC.

In addition although a multivibrator is shown for detecting three sequential clock periods without a transition, other circuitry suitable for detecting such a data sequence may be used. In addition, the data sequence for incrementing the count may be two sequential clock periods without a transition in the signal 116, four clock periods or any other sequence of the output signal 116.

A further possible modification is to reset the count of the counter to prevent significant overshooting or undershooting by the feedback signal if the analog input signal stabilizes after a significant increase. When the feedback signal overshoots or undershoots with a relatively fast change in the magnitude of the input signal, the current from the DAC 130 may be at a maximum magnitude. Therefore, it may be desirable to decrease the current quickly to minimize ensuing overshoots or undershoots and to improve the resolution. Count monitoring circuitry (not shown) that can monitor the output of the edge detector 120 can look for a pulse after while the count value of the counter 126 is above a predetermined limit. The monitoring circuitry can reset the counter 126 to a smaller count to prevent an overshoot or an undershoot.

Figure 4:
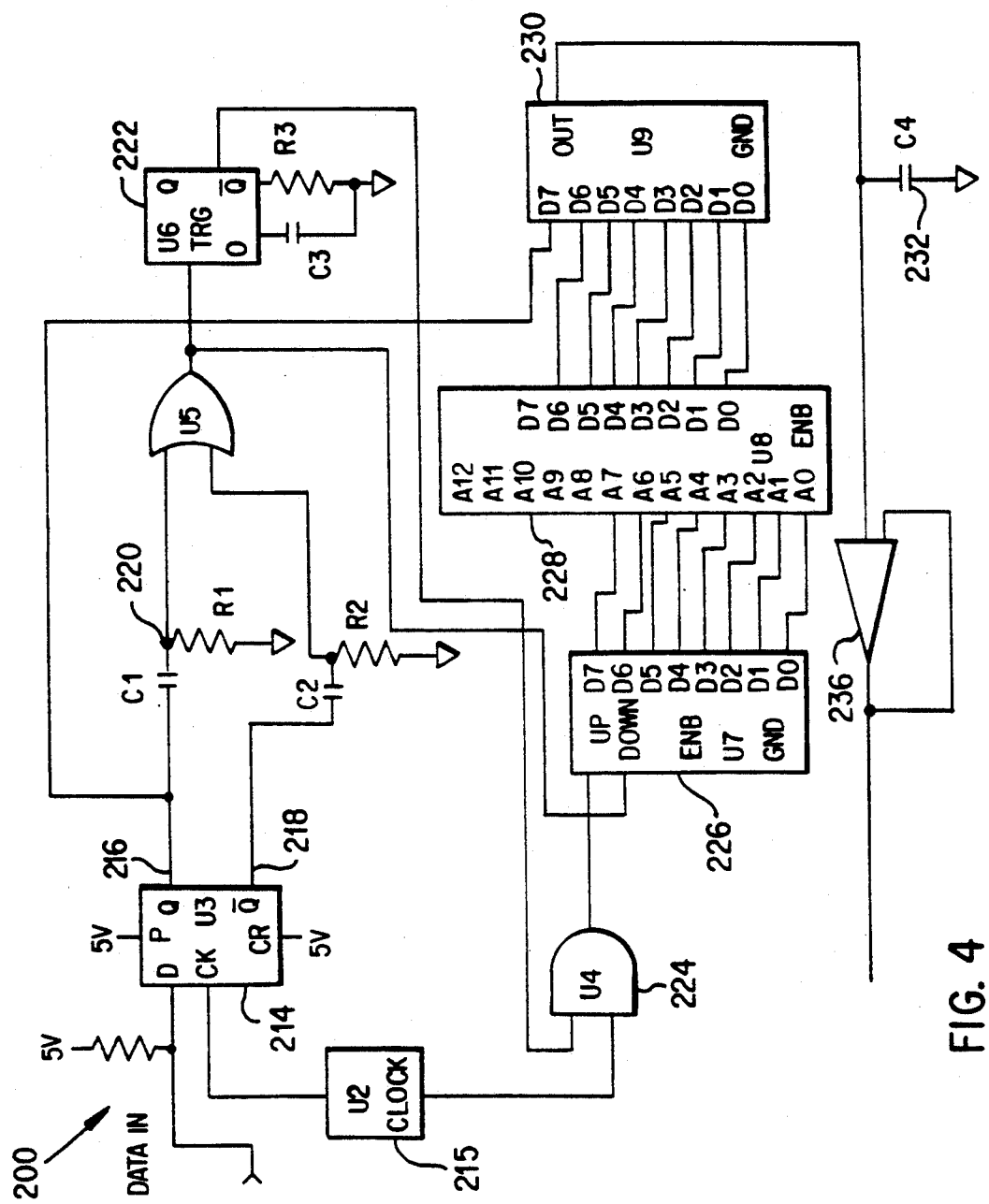
FIG. 4 is a schematic diagram of a converter for converting the output of the delta modulator of FIG. 2 back into an analog signal.

FIG. 4 shows a compatible digital to analog converter 200 with like parts bearing like numbers. The serial input data is synchronized to a local clock generator 215 by a D flip flop 214. The synchronized data 216 and the inverted synchronized data 218 are supplied to an edge detector 220, which in turn is coupled to a down counting input of a counter 226 and a timer 222 such as a multivibrator. The time out period for the timer 226 should be identical to the time out period of the timer 222 in the analog to digital converter 100.

The output of the clock generator 215 is gated by the output of the timer 222 through an AND gate 224 and provides the up counting pulses for the counter 226. The counter 226 again must have circuitry to prevent an underflow and overflow condition. The output of the counter 226 is coupled to the address lines of a ROM 228 that should preferably store the same transfer function or functions as the ROM 128 in the modulator 100.

The data output of the ROM 228 is supplied to a digital to analog current converter 230. The most significant bit of the converter is used for reversing current flow of the DAC 230 and is coupled to the output of the synchronizing flip flop 216. The output of the converter 230 is coupled to an integrating capacitor 232. A buffer amplifier 236 is coupled to the capacitor 232 and provides the output analog signal.

The digital to analog converter 200 of FIG. 4 may also be modified in a manner similar to how the analog to digital converter 100 of FIG. 3 may be modified For example, multiple transfer functions may be stored in the ROM 228 and the selection between those functions may be controlled by logic monitoring the output sequence and the control logic; the timer 222 may be replaced with different circuitry or detect a different sequence, and in certain situations the ROM 228 may be eliminated entirely. Preferably the same modifications should be made to both the analog to digital converter 100 and the digital to analog converter 200 to reproduce at the output of the converter 200 an accurate facsimile of the analog input converter 100.

It will further be understood by those of ordinary skill in the art that many other alternative embodiments of the disclosed system can be built with double integration delta modulators, delta sigma modulators, or high information delta modulators. The scope of the invention is, of course, defined by the claims.

I claim:

1. In a delta modulator for converting an analog input signal into a digital output signal, the output of the modulator providing periodic samples of a comparison between the analog input signal and an integration of the output signal, wherein the integration occurs in response to an adjustable second signal, the improvement comprising:
   a detector responsive to changes in the output of the delta modulator; and
   a processing circuit responsive to the detector for adjusting the second signal at designatable increasing substantially linear first changes in magnitude in response to an absence of a change within a predetermined number of sequential samples and for otherwise adjusting at decreasing substantially different designatable second changes in magnitude.

2. The modulator of claim 1, wherein the predetermined number of samples is greater than 2.

3. In a delta modulator for converting an analog input signal into a digital output signal, the output of the modulator providing periodic samples of a comparison between the analog input signal and an integration of the output signal, wherein the integration occurs in response to a current at an adjustable rate, the improvement comprising:
   a detector responsive to the output of delta modulator; and
   a processing circuit responsive to the detector for adjusting designatable rates of integration in response to an absence of a change in the output of the modulator within a predetermined period of time and for otherwise adjusting the rate of integration differently, the processing circuitry further including a memory storing data representing at least one transfer function, the processing circuit using the stored data of the transfer function for altering the rate of integration.

4. The delta modulator of claim 3, wherein the at least one transfer function comprises one of a group of a linear, positively sloped transfer function, a linear, negatively sloped transfer function and a non-linear transfer function.

5. In a delta modulator for converting an analog input signal into a digital output signal, the output of the modulator providing periodic samples of a comparison between the analog input signal and an integration of the output signal, wherein the integration occurs in response to a current at an adjustable rate, the improvement comprising:
   a detector responsive to the output of delta modulator, the output of the detector reflecting at least the status of the two immediately proceeding outputs of the delta modulator; and
   a processing circuit responsive to the detector for adjusting at designatable rates of integration in response to the output of the detector and for otherwise adjusting the rate of integration differently, wherein the processing circuit has different transfer functions for adjusting the rate of integration and the selection of the transfer functions occurs in response to the output of the detector.

6. A method for converting an analog input signal into a digital output signal having first and second states, the method comprising:
   accumulating in an accumulator a parameter and generating a feedback signal based upon that accumulated parameter;
   monitoring the output signal for a first sequence where the output signal remains in one state for a first time interval and for a second sequence where the output changes states in a second time interval, the second time interval being less than first time interval;
   controlling the change of accumulation of the accumulator in response to the monitoring differently in response to different sequences; and
   comparing the feedback signal with the input signal and generating the first state if the input signal is greater than the feedback signal and generating the other signal otherwise.

7. The method of claim 6, the method further comprising incrementing or decrementing the parameter in a linear manner.

8. In a delta modulator for converting an analog signal into a digital output signal, the output of the modulator providing sequential samples of a comparison between the analog input signal and an integration of the output signal, wherein the integration occurs in response to a controlled signal, the improvement comprising:
   an accumulator that accumulates a count;
   means for controlling the magnitude of the controlled signal in differing proportions to the count;
   a means for reversing the polarity of the controlled signal based upon the output signal; and
   means for increasing the count in response to the absence of a change in the output and to otherwise decreasing the count to a minimum, the means for increasing and decreasing the count increasing the count in response to the predetermined sequence and otherwise decreasing the count; and wherein the means for controlling the controlled signal comprises a digital to analog converter responsive to the accumulator for generating a magnitude proportional to the count.

9. The modulator of claim 8, wherein the means for controlling the magnitude further comprises a memory storing data representing at least one transfer function with the counter providing the addresses to the memory and a digital to analog converter converting the data read out of the memory into a current.

10. A method for converting an analog input signal into an output digital signal having first and second states by using a feedback signal, the method comprising:
   comparing the input signal with the feedback signal and providing an output indicating which of the signals is greater;
   sampling the output of the comparison to provide the output digital signal;
   detecting changes in the output digital signal; and
   altering the feedback signal at designatable substantially linear increasing rates in response to a first sequence of the transitions and otherwise altering the magnitude of the feedback signal at designatable decreasing substantially linear rates.

11. A processor for converting an input delta modulated digital signal having transitions into an analog signal, the processor comprising:
   a detector for providing at least one signal for each transition of the input signal;
   an accumulator having an adjustable rate of accumulation, the accumulator including a capacitor;
   means for designating the rate of accumulation in response to different sequences of transitions comprised of a digital to analog current converter coupled to the capacitor and responsive to the first sequence by increasing the current and otherwise decreasing the current;
   means for producing an analog output signal based upon the accumulation.

12. A method for converting an analog input signal into an output digital signal having first and second states by using a feedback signal, the method comprising:
   comparing the input signal with the feedback signal and providing an output indicating which of the signals is greater;
   sampling the output of the comparison to provide the output digital signal;
   detecting transitions in the output digital signal; and
   altering the feedback signal at designatable increasing rates in response to a sequence of the transitions and otherwise altering the magnitude of the feedback signal at designatable decreasing rates; and
   providing a circuit having selectable transfer functions for altering the designatable rates for altering the feedback signal.

13. The method of claim 12, wherein the method includes selecting the transfer function based upon at least one of the anticipated characteristics of the input signal and sequence of the output digital signal.

14. A processor for converting an input delta modulated digital signal having transitions into an analog signal, the processor comprising:
   a detector for providing a signal for each transition in the input signal;
   an accumulator;
   means for designating the rate of accumulation differently in response to different sequences of transitions; and
   means for producing an analog output signal based upon the accumulation.

15. The processor of claim 14, wherein the means for producing the analog signal includes a digital to analog converter having an output directly proportional to the count of the accumulator and the polarity of the output of the digital to analog converter is reversed based upon the input signal.

16. A method for converting a digital delta modulator input signal, the digital signal being in one of two states, into an analog output signal, the method comprising:
   detecting different sequences in the state of the digital input signal;
   counting a timing signal in a first direction in response to detecting a first sequence;
   reversing the direction of counting in response to a different sequence;
   supplying the count as the input to a digital to analog converter; and
   integrating the output of the digital to analog converter to provide an output analog signal.

17. A method for converting a digital delta modulated input signal into an analog output signal, the method comprising:
   detecting changes in the digital input signal;
   integrating the input signal at designatable rates, in response to at least one of the expected characteristics of the analog output signal and the changing rates being different with respect to different sequences in the input signal.

18. The method for converting of claim 17, wherein the step of integrating includes:
   timing the absence of changes in the input signal; and
   increasing the rate of integration in the absence of a change in a predetermined time period.

19. The method of claim 18, wherein the step of integrating further includes:
   counting a timing signal with the count being increased during the absence of a transition in the predetermined time period and being decreased otherwise;
   using the current count to control a digital to analog converter, the analog output of the converter being integrated.

20. A delta modulator for converting an analog input signal into a digital output signal having two states based upon the comparison of an input signal to a feedback signal, the modulator comprised of:

a comparator having an output representative of the comparison of an input signal and a feedback signal;

a sampler producing sequential samples of the input signal, each sample having a period;

a detector responsive to the sequential samples; and means for producing the feedback signal, the magnitude of the feedback signal decreasing towards a minimum magnitude whenever the output signal changes state and increasing differently towards a maximum whenever the output fails to change state for more than two sampling periods.

21. The modulator of claim 20, wherein the means for producing the feedback signal includes at least two transfer functions for changing the magnitude of the feedback signal differently, the first of the transfer functions being selected in response to an absence of a change in the output signal and the second transfer function being selected in response to a change in the output signal.

22. In a delta modulator for converting an analog input signal into a digital signal having one of two states, the output of the modulator providing sequential samples of a comparison between the analog input signal and an integration of a controlled parameter, the improvement comprising:

a detector responsive to changes in the state of the output signal;

a control element having a plurality of different transfer functions for changing the parameter, the control element further being responsive to the detector and selecting a different transfer function in response to changes in the digital output to thereby alter the parameter differently thereafter.

23. The modulator of claim 22, wherein the transfer functions include at least two linear transfer functions having different slopes, the control element selecting one of the linear transfer functions in response to a change in the digital output and for otherwise selecting another linear transfer function.

24. In a delta modulator for converting an analog signal into a digital output signal, the output of the modulator providing sequential samples of a comparison between the analog input signal and an integration of the output signal, wherein the integration occurs in response to a controlled signal, the improvement comprising:

an accumulator that accumulates a count;

means for controlling the magnitude of the controlled signal in differing proportions to the count;

means for increasing the count in response to the absence of a change in the output and to otherwise decreasing the count to a minimum, the increasing of the count occurs only after more than two sequential samples in the same state while the decrementing of the count occurs after any change in the state of the output signal.

25. A processor for converting an input analog signal into a digital output signal having transitions, the processor comprising:

a detector for providing at least one signal for each change in the output signal;

an accumulator having an adjustable accumulation;

means for controlling the accumulation differently in response to different sequences of changes;

means for producing a feedback signal based upon the accumulation;

a comparator for comparing the input signal with the feedback signal; and a sampler for sampling the output of the comparator, the samples output of the comparator being the digital output.

26. The processor of claim 25, the means for controlling the plurality of different transfer functions for controlling the accumulation, the selection of the transfer functions depending upon the presence or absence of changes.

27. The processor of claim 25, wherein a sequence for increasing the accumulation comprises the absence of a change in the state of the output signal for more than two successive samples.

28. A processor for converting an input analog signal into a digital output signal having transitions, the process comprising:

comparing a feedback signal and the analog input signal;

periodically sampling the result of the comparison;

detecting changes in successive samples;

accumulating a parameter at an adjustable rate of accumulation, controlling the rate of accumulation differently in response to the detection of different sequences of changes; and producing the feedback signal based upon the accumulation.

29. The process of claim 28, wherein the first sequence comprises the absence of a change in the state of the output signal for more than two successive samples.

30. The process of claim 28, wherein producing the feedback signal includes supplying a current proportional to the accumulated parameter to a capacitor and the rate of accumulation being responsive to the first sequence by increasing the magnitude of the current and otherwise decreasing the magnitude of the current.

31. The process of claim 28, wherein controlling the change in the rage of accumulation is altered in response to the presence or absence of a change in the output.

* * * * *